(12) United States Patent
Itou et al.

(10) Patent No.: US 11,784,612 B2
(45) Date of Patent: Oct. 10, 2023

(54) SIGNAL DETECTION CIRCUIT

(71) Applicant: DENSO CORPORATION, Kariya (JP)

(72) Inventors: Takasuke Itou, Kariya (JP); Tomohiro Nezuka, Kariya (JP); Yasuaki Aoki, Kariya (JP); Yuuta Nakamura, Kariya (JP); Takashi Yoshiya, Kariya (JP)

(73) Assignee: DENSO CORPORATION, Kariya (JP)

( * ) Notice: Subject to any disclaimer, the term of this patent is extended or adjusted under 35 U.S.C. 154(b) by 1 day.

(21) Appl. No.: 17/545,035

(22) Filed: Dec. 8, 2021

(65) Prior Publication Data

US 2022/0094309 A1 Mar. 24, 2022

Related U.S. Application Data

(63) Continuation of application No. PCT/JP2020/023033, filed on Jun. 11, 2020.

(30) Foreign Application Priority Data

Jun. 17, 2019 (JP) ................. 2019-111974

(51) Int. Cl.
*H03F 3/00* (2006.01)
*H03F 3/45* (2006.01)
*G11C 27/02* (2006.01)

(52) U.S. Cl.
CPC ........... *H03F 3/005* (2013.01); *G11C 27/024* (2013.01); *H03F 3/45* (2013.01)

(58) Field of Classification Search
CPC ........ H03F 3/005; H03F 3/45; H03F 3/45475; H03K 17/00; H03K 17/16; G11C 27/02; G11C 27/024; G11C 27/026; G11C 27/028
See application file for complete search history.

(56) References Cited

U.S. PATENT DOCUMENTS

| 5,892,473 | A | * | 4/1999 | Shin ............... H03M 3/358 341/150 |
| 5,926,012 | A | | 7/1999 | Takizawa et al. |
| 6,011,413 | A | | 1/2000 | Hayakawa et al. |
| 8,223,059 | B2 | * | 7/2012 | Ono .............. H03M 1/0607 341/172 |
| 2009/0026977 | A1 | | 1/2009 | Omi |
| 2013/0181631 | A1 | | 7/2013 | Omi |
| 2019/0089346 | A1 | | 3/2019 | Kawai |
| 2020/0144998 | A1 | | 5/2020 | Inoue |

FOREIGN PATENT DOCUMENTS

JP 2008-283498 A 11/2008

* cited by examiner

*Primary Examiner* — Jung Kim
(74) *Attorney, Agent, or Firm* — POSZ LAW GROUP, PLC

(57) ABSTRACT

A signal detection circuit includes: a first capacitor having a first terminal connected with a first main terminal of a switching element; a second capacitor having a first terminal connected with a second main terminal of the switching element; and a detection circuit having a differential circuit configuration. The detection circuit receives, as input signals, a signal from a second terminal of the first capacitor and a signal from a second terminal of the second capacitor, detects detection target signals based on the input signals. The detection target signals include a signal of the first main terminal of the switching element and a signal of the second main terminal of the switching element.

10 Claims, 16 Drawing Sheets

SIGNAL DETECTION CIRCUIT

CROSS REFERENCE TO RELATED APPLICATION

The present application is a continuation application of International Patent Application No. PCT/JP2020/023033 filed on Jun. 11, 2020, which designated the U.S. and claims the benefit of priority from Japanese Patent Application No. 2019-111974 filed on Jun. 17, 2019. The entire disclosures of all of the above applications are incorporated herein by reference.

TECHNICAL FIELD

The present disclosure relates to a signal detection circuit that detects a signal of a main terminal of a switching element.

BACKGROUND

Conventionally, a circuit that adjusts an applying time of a signal to a gate of a switching element based on a detection result of a voltage between a drain and a source of the switching element is used.

SUMMARY

The present disclosure provides a signal detection circuit. The signal detection circuit includes: a first capacitor having a first terminal connected with a first main terminal of a switching element; a second capacitor having a first terminal connected with a second main terminal of the switching element; and a detection circuit having a differential circuit configuration. The detection circuit receives, as input signals, a signal from a second terminal of the first capacitor and a signal from a second terminal of the second capacitor, detects detection target signals based on the input signals. The detection target signals include a signal of the first main terminal of the switching element and a signal of the second main terminal of the switching element.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
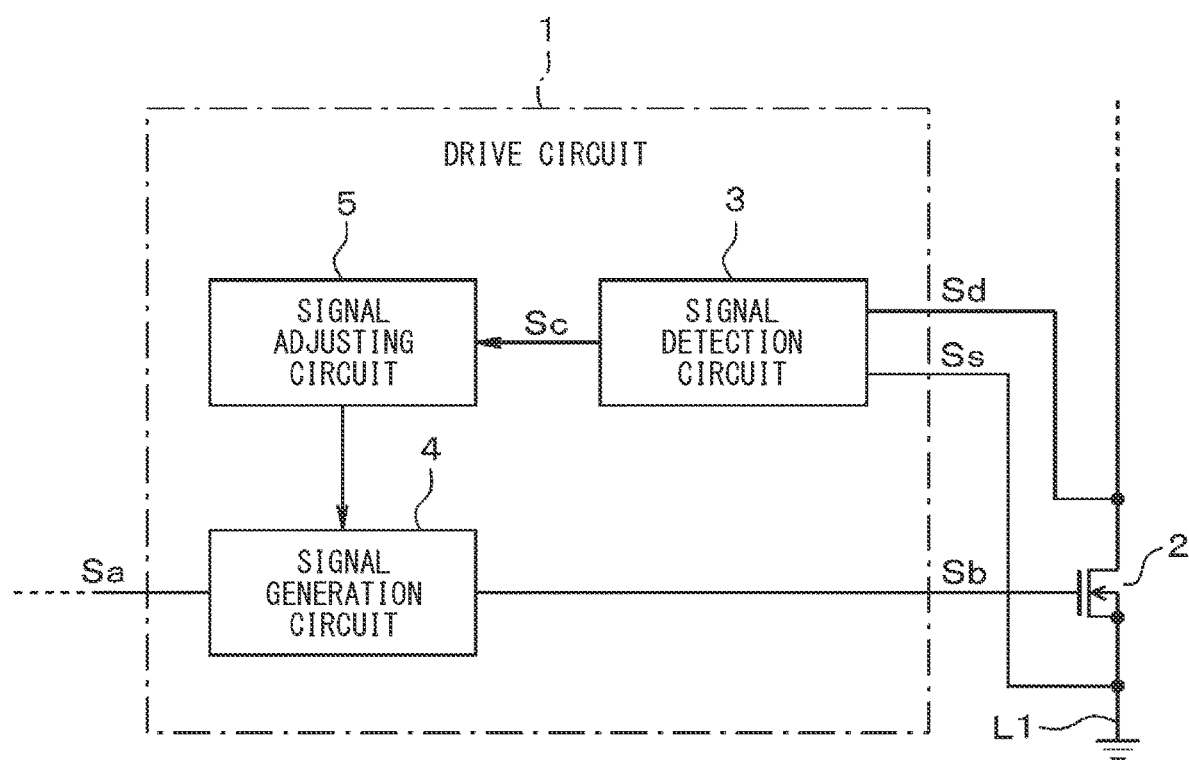
FIG. 1 is a diagram schematically showing a configuration of a drive circuit according to a first embodiment.

There has been known a configuration that adjusts an applying time of a signal to a gate of a switching element based on a detection result of a voltage between a drain and a source of the switching element, such as MOSFET. The voltage between the drain and source of the switching element is also known as a load signal. In such a configuration, a signal detection circuit, which is a circuit for detecting the load signal of the switching element, is used.

In the above-described signal detection circuit, when a relatively high voltage is generated between the drain and the source, that is, usage in a high voltage application, a high withstand voltage element having a relatively high withstand voltage is required to be used. Thus, an increase in circuit area may occur for integrating the high withstand voltage element. Conventionally, it has been considered to provide a voltage division circuit including an element such as a capacitor on an input side of the signal detection circuit in order to reduce the voltage between the drain and the source before inputting the voltage to the signal detection circuit.

The above-described conventional configuration has the following difficulties. In a configuration where a capacitor or the like configuring the voltage division circuit is mounted as an external component of an integrated circuit (IC), a miniaturization of the signal detection circuit as a whole may be difficult. Further, when a capacitor or the like configuring the voltage division circuit is built in the IC, a capacitance of the capacitor must be reduced. This may cause a decrease in signal detection accuracy due to an influence of the parasitic capacitance.

According to an aspect of the present disclosure, a signal detection circuit includes: a first capacitor having a first terminal connected with a first main terminal of a switching element; a second capacitor having a first terminal connected with a second main terminal of the switching element; and a detection circuit having a differential circuit configuration. The detection circuit receives, as input signals, a signal from a second terminal of the first capacitor and a signal from a second terminal of the second capacitor, detects detection target signals based on the input signals. The detection target signals include a signal of the first main terminal of the switching element and a signal of the second main terminal of the switching element.

In the above configuration, the signals of the main terminals of the switching element are input to the detection circuit in differential manner. When the capacitances of the first capacitor and the second capacitor provided on the input side of the detection circuit are relatively small, adverse influence of the parasitic capacitances on the detection accuracy of the detection target signals can be restricted. Therefore, elements including the first capacitor and the second capacitor configuring the signal detection circuit of the above configuration can be integrated together to provide a compact size circuit. According to the above configuration, it is possible to obtain an excellent effect that the detection accuracy can be improved while suppressing an increase in circuit size.

The following will describe embodiments of the present disclosure with reference to the accompanying drawings. In each embodiment, the substantially same components are denoted by the same reference numerals and description thereof will be omitted.

First Embodiment

The following will describe a first embodiment of the present disclosure with reference to FIG. 1 to FIG. 8.

General Configuration

As shown in FIG. 1, in the present embodiment, a drive circuit 1 drives a low-side switching element 2. The low-side switching element 2 and a high-side switching element configure a half-bridge circuit connected between a pair of direct current power supply lines. The switching element 2 is a semiconductor switching element. In the present embodiment, the switching element 2 is provided by an n-channel MOSFET. The switching element 2 includes a drain as one of main terminals, and the drain is connected to the DC power supply line on a high potential side via a high-side switching element (not shown) disposed on a high side. The switching element 2 includes a source as the other one of main terminals, and the source is connected to the DC power supply line L1 on a low potential side.

In the present embodiment, a relatively high voltage of, for example, several hundred volts is applied between the pair of DC power supply lines described above. That is, the switching element 2 is used for high voltage applications. The drive circuit 1 drives the switching element 2 by generating a gate signal Sb based on a control signal Sa or the like provided from an external source, and applying the gate signal Sb to the gate of the switching element 2.

The drive circuit 1 is configured as a semiconductor integrated circuit, that is, an IC, and includes a signal detection circuit 3, a signal generation circuit 4, a signal adjusting circuit 5, and the like. The signals of the main terminals of the switching element 2, that is, the signal Ss of the source of the switching element 2 and the signal Sd of the drain of the switching element 2 are input to the signal detection circuit 3. Therefore, the signals Ss and Sd correspond to detection target signals to be detected by the signal detection circuit 3. That is, in the present embodiment, the detection target signal is a voltage VDS between the drain and the source of the switching element 2.

The detection target signal may be a current flowing through the switching element 2 or a combination of the voltage and the current. The signal detection circuit 3 outputs a detection signal Sc that corresponds to a detection result of the detection target signal. The detection signal Sc is a binary signal that inverts in response to the voltage VDS reaching a predetermined reference voltage Vref.

By using the detection signal Sc output from the signal detection circuit 3, it is possible to detect whether a peak value of the voltage VDS exceeds a predetermined upper limit. A reference voltage Vref may be set to have a voltage value corresponding to the above-described upper limit. Further, by using the detection signal Sc output from the signal detection circuit 3, it is possible to detect a slew rate of the voltage VDS at the time of turn-on or turn-off of the switching element 2, that is, at the time of switching operation. The reference voltage Vref is switched to multiple voltage levels during the turn-on or turn-off period of the switching element 2. With this configuration, it is possible to acquire the time at which the voltage VDS reaches each voltage level based on the detection signal Sc, and the slew rate of the voltage VDS can be detected each time the voltage VDS reaches the corresponding voltage level.

The signal generation circuit 4 generates a gate signal Sb based on a control signal Sa provided by an external source. The gate signal Sb is used to turn on or turn off the switching element 2 in a complementary manner with the high-side switching element (not shown). The signal adjusting circuit 5 adjusts the gate signal Sb generated in the signal generation circuit 4 based on the detection signal Sc output from the signal detection circuit 3. The signal adjusting circuit 5 switches a resistance of a gate resistance (not shown) provided in a supply path of the gate signal Sb according to the detection signal Sc. That is, the signal adjusting circuit 5 switches a drive capability of the drive circuit 1 according to the detection signal Sc.

The following will describe the adjustment of the gate signal by the signal adjusting circuit 5. The signal adjusting circuit 5 detects whether the peak value of the voltage VDS during the switching operation of the switching element 2 exceeds the upper limit based on the detection signal Sc. In response to detection of the peak value exceeding the upper limit, the signal adjusting circuit 5 increases the resistance of the gate resistor to decrease the drive capability of the drive circuit 1. In response to detection of the peak value not exceeding the upper limit, the signal adjusting circuit 5 decreases the resistance of the gate resistor to increase the drive capability of the driver circuit 1. With this configuration, the peak value of the voltage VDS during the switching operation of the switching element 2 can be controlled to be less than a predetermined upper limit, that is, to be an optimum value.

The signal adjusting circuit 5 detects the slew rate of the voltage VDS during the switching operation of the switching element 2 based on the detection signal Sc. When the detected slew rate is equal to or higher than a predetermined threshold, the signal adjusting circuit 5 increases the resistance of the gate resistance to decrease the drive capability of the drive circuit 1. When the detected slew rate is lower than the predetermined threshold, the signal adjusting circuit 5 decreases the resistance of the gate resistance to increase the drive capability of the drive circuit 1. With this configuration, the slew rate of the voltage VDS during the switching operation of the switching element 2 can be controlled to be lower than a predetermined threshold value, that is, to be an optimum value.

Configuration of Signal Detection Circuit

Figure 2:
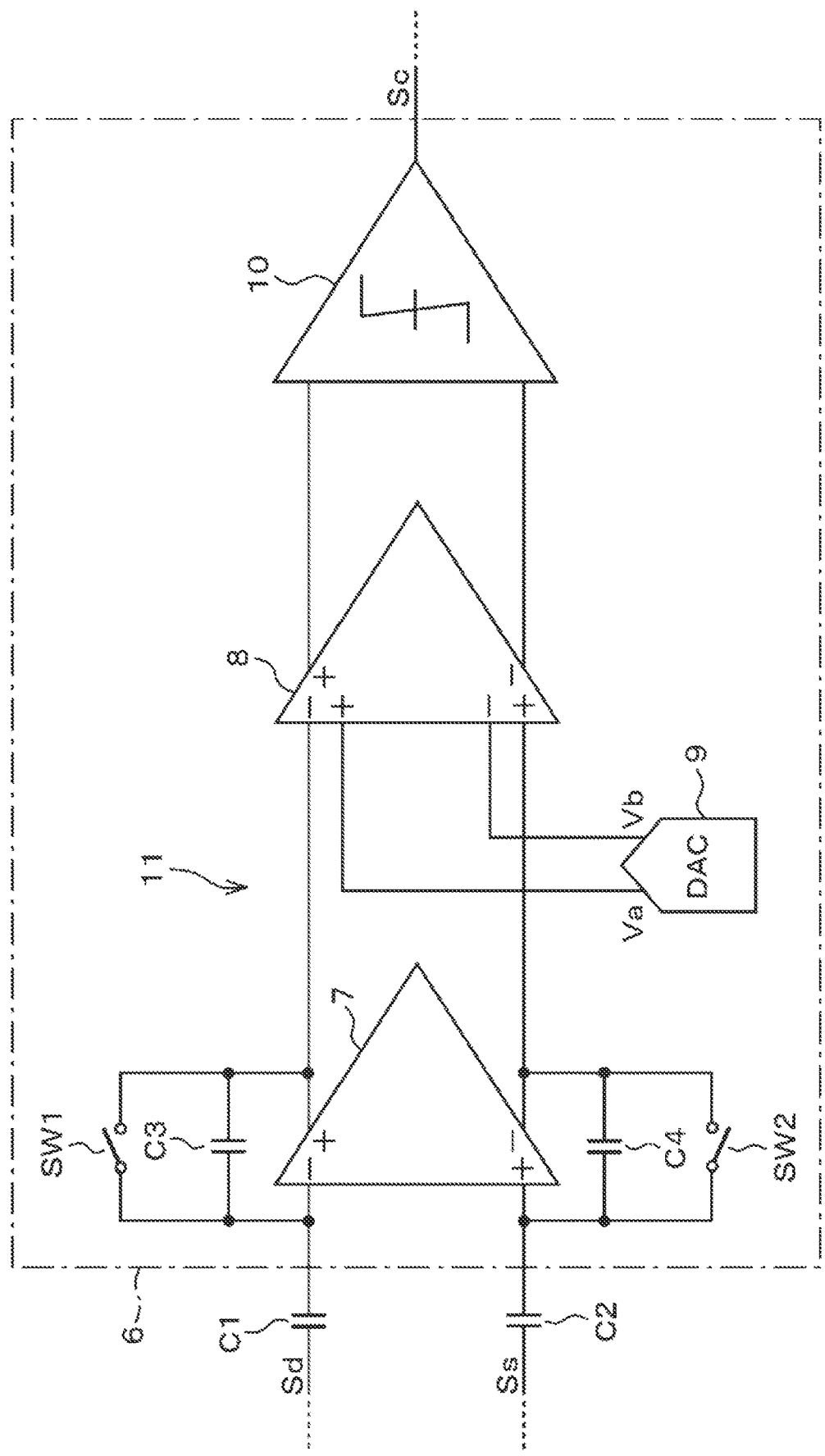
FIG. 2 is a diagram schematically showing a first configuration example of a signal detection circuit according to the first embodiment.
Figure 3:
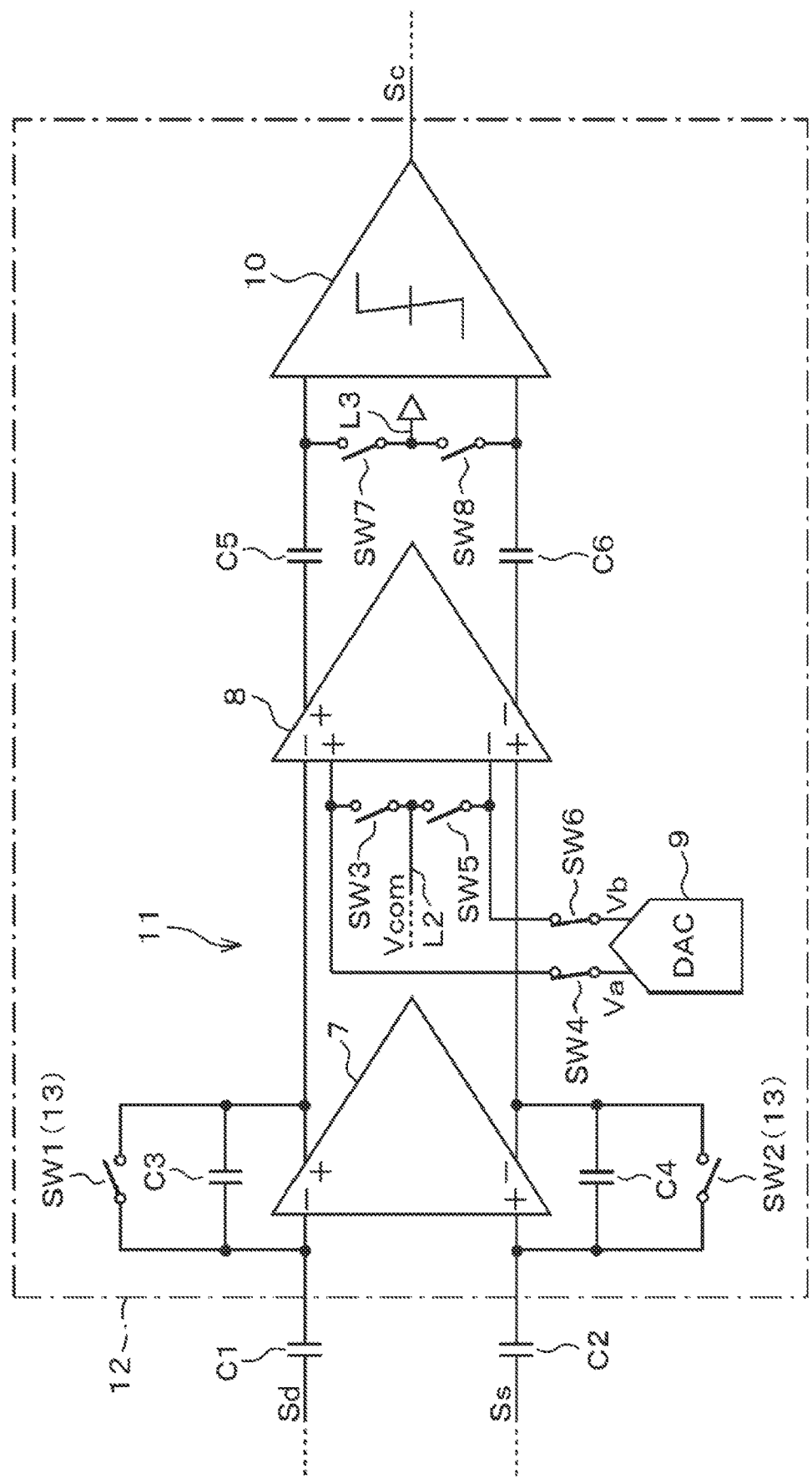
FIG. 3 is a diagram schematically showing a second configuration example of a signal detection circuit according to the first embodiment.

For example, the signal detection circuit 3 may have a first configuration example as shown in FIG. 2 or a second configuration example as shown in FIG. 3. As shown in FIG. 2, the signal detection circuit 3A of the first configuration example includes capacitors C1 and C2 and a detection circuit 6. The capacitor C1 corresponds to a first capacitor, and one terminal of the first capacitor C1 is connected to the drain of the switching element 2. The capacitor C2 corresponds to a second capacitor, and one terminal of the second capacitor C2 is connected to the source of the switching element 2.

In the first configuration example, one terminal of the first capacitor C1 is connected to the drain of the switching element 2 without a switch that can open or close the line between the first capacitor and the drain of the switching element. One terminal of the second capacitor C2 is connected to the source of the switching element 2 without a switch that can open or close the line between the second capacitor and the source of the switching element. The other terminal of the capacitor C1 and the other terminal of the capacitor C2 are connected to the detection circuit 6.

The detection circuit 6 receives the signal from the other terminal of the capacitor C1 and the signal from the other terminal of the capacitor C2, and detects the detection target signal based on the received signals. The detection circuit 6 has a differential configuration including capacitors C3 and C4, switches SW1 and SW2, differential amplifiers 7 and 8, a digital-to-analog converter 9, and a comparator 10. In the present disclosure, the digital-to-analog converter may also be referred to as a DAC. The differential amplifier 7 is a fully differential amplifier. The other terminal of the capacitor C1 is connected to an inverting input terminal of the differential amplifier 7, and the other terminal of the capacitor C2 is connected to a non-inverting input terminal of the differential amplifier 7.

A capacitor C3 and a switch SW1 are connected in parallel between the inverting input terminal and a non-inverting output terminal of the differential amplifier 7. A capacitor C4 and a switch SW2 are connected in parallel between the non-inverting input terminal and an inverting output terminal of the differential amplifier 7. The differential amplifier 8 is a fully differential amplifier. The non-inverting output terminal of the differential amplifier 7 is connected to an inverting input terminal of the differential amplifier 8, and the inverting output terminal of the differential amplifier 7 is connected to a non-inverting input terminal of the differential amplifier 8.

An offset value of the output signal output from the non-inverting output terminal of the differential amplifier 8, that is, an output offset voltage from the non-inverting output terminal is set to a value corresponding to a voltage Va output from the DAC 9. An offset value of the output signal output from the inverting output terminal of the differential amplifier 8, that is, an output offset voltage from the inverting output terminal is set to a value corresponding to a voltage Vb output from the DAC 9. In this configuration, by setting the voltages Va and Vb output from the DAC 9 independently from one another, the output offset voltage from the non-inverting terminal of the differential amplifier 8 and the output offset voltage from the inverting terminal of the differential amplifier 8 can be individually controlled from one another.

The voltage values of the voltages Va and Vb may be appropriately set corresponding to the above-described reference voltage Vref. In the above configuration, the two differential amplifiers 7 and 8 constitute an amplifier 11 that receives, as input signals, signals from the capacitors C1 and C2 and outputs signals obtained by amplifying the input signals. In the present disclosure, amplifying indicates amplifying by an amplification factor of 1 or greater, and also indicates amplifying by an amplification factor of less than 1, that is, attenuation.

The non-inverting output terminal of the differential amplifier 8 is connected to one input terminal of the comparator 10. The inverting output terminal of the differential amplifier 8 is connected to the other input terminal of the comparator 10. That is, the output signals from the amplifier 11 are input to the comparator 10. In the above configuration, a signal output from the output terminal of the comparator 10 corresponds to the detection signal Sc described above.

As shown in FIG. 3, the signal detection circuit 3B having the second configuration example is different from the signal detection circuit 3A having the first configuration example in that a detection circuit 12 is provided instead of the detection circuit 6. The detection circuit 12 includes switches SW3 to SW8 and capacitors C5 and C6 in addition to the components of the detection circuit 6. In the second configuration example, the switches SW1 and SW2 function as an identical signal input unit 13 for inputting an identical signal to each input terminal of the amplifier 11.

The offset value of the output signal output from the non-inverting output terminal of the differential amplifier 8, that is, the terminal for determining the output offset voltage on the non-inverting side is connected to the power supply line L2 to which a common voltage Vcom is applied via the switch SW3. The terminal for determining the output offset voltage on the non-inverting side is also connected to one output terminal of the DAC 9 via the switch SW4. The switches SW3 and SW4 turn on and turn off in complementary manner. In the above configuration, the output offset voltage on the non-inverting side of the differential amplifier 8 is set to the common voltage Vcom during a turn-on state of the switch SW3. The output offset voltage on the non-inverting side of the differential amplifier 8 is set to a value corresponding to the voltage Va output from one output terminal of the DAC 9 during a turn-on state of the switch SW4.

The offset value of the output signal output from the inverting output terminal of the differential amplifier 8, that is, the terminal for determining the output offset voltage on the inverting side is connected to the power supply line L2 via the switch SW5. The terminal for determining the output offset voltage on the inverting side is also connected to the other output terminal of the DAC 9 via the switch SW6. The switches SW5 and SW6 turn on and turn off in a complementary manner. In the above configuration, the output offset voltage on the inverting side of the differential amplifier 8 is set to the common voltage Vcom during a turn-on state of the switch SW5. The output offset voltage on the inverting side of the differential amplifier 8 is set to a value corresponding to the voltage Vb output from the other output terminal of the DAC 9 during a turn-on state of the switch SW6. In this configuration, the output offset on the non-inverting side and the output offset voltage on the inverting side of the differential amplifier 8 can also be individually controlled similar to the first configuration example.

One terminal of the capacitor C5 is connected to the non-inverting output terminal of the differential amplifier 8, and the other terminal of the capacitor C5 is connected to one input terminal of the comparator 10. One terminal of the capacitor C6 is connected to the inverting output terminal of the differential amplifier 8, and the other terminal of the capacitor C6 is connected to the other input terminal of the comparator 10.

Each of the capacitors C5 and C6 functions as a storage capacitor by connecting one terminal with the output terminal of the amplifier 11 and connecting the other terminal with the input terminal of the comparator 10. The other terminal of the capacitor C5 is connected, via a switch SW7, to a power supply line L3 to which a predetermined reference potential is applied. The other terminal of the capacitor C6 is connected to the power supply line L3 via the switch SW8. The reference potential applied to the power supply line L3 is, for example, a reference potential of the circuit, that is, a ground voltage of 0 Volt.

The following will describe an operation of the above configuration. First, a detection operation according to the first configuration example will be described.

The detection operation executed by the signal detection circuit 3A of the first configuration example will be described with reference to FIG. 4A to FIG. 4D. FIG. 4A to FIG. 4D show signals in a case where an operating state of the switching element 2 switches from a turn-on state to a turn-off state, and then switches from the turn-off state to the turn-on state again. The output signal on the non-inverting output side of the differential amplifier 7 is shown as O1+, and the output signal on the inverting output side of the differential amplifier 7 is shown as O1−. The output signal on the non-inverting output side of the differential amplifier 8 is shown as O2+, and the output signal on the inverting output side of the differential amplifier 8 is shown as O2−.

The signal Ss corresponding to the source voltage of the switching element 2 has the voltage VL (for example, 0 Volt) of the DC power supply line L1 throughout an entire operation period. The signal Sd corresponding to the drain voltage of the switching element 2 has the voltage VL during the turn-on state of the switching element 2, and has the voltage VH (for example, several hundreds of volts) of the direct current power supply line on the high potential side during the turn-off state of the switching element 2. The signals Sd and Ss are input to the differential amplifier 7 via the capacitors C1 and C2, respectively.

During the detection operation of the signal detection circuit 3A, the switches SW1 and SW2 are in off states as shown in FIG. 2. Since the switch SW1 is in off state, a signal obtained by dividing the signal Sd using the capacitors C1 and C3 is input to the input terminal of the differential amplifier 7. Since the switch SW2 is in off state, a signal obtained by dividing the signal Ss using the capacitors C2 and C4 is input to the input terminal of the differential amplifier 7.

In the present embodiment, the drain voltage and the source voltage of the switching element 2 are decreased by the voltage dividing circuit provided by the capacitors C1 and C3 and the voltage dividing circuit provided by the capacitors C2 and C4. Then, the decreased voltages are input to the amplifier 11. Thus, as circuit components, low withstand voltage elements having relatively low withstand voltages can be used in a stage of the circuit subsequent to the voltage dividing circuits.

When the above-described signals are input to the differential amplifier 7, the differential amplifier 7 outputs signals O1+ and O1− which are signals representing a difference between the signal Sd and the signal Ss. The output signals O1+ and O1− are differential signals having phases opposite to one another. The voltage amplitudes of the output signals O1+ and O1− have values corresponding to the power supply voltage supplied to the differential amplifier 7. When the above-described differential signals output from the differential amplifier 7 are input to the differential amplifier 8, output signals O2+ and O2−, which are also differential signals and change in the same manner as the output signals O1+ and O1−, are output from the subsequent differential amplifier 8.

Figure 4A:
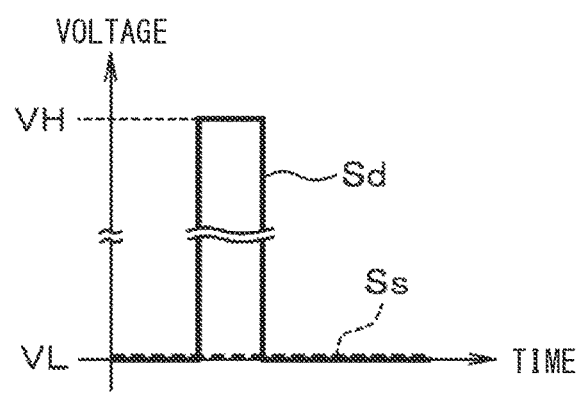
FIG. 4A, FIG. 4B, FIG. 4C and FIG. 4D are time charts schematically showing signals at respective points during execution of a basic detection operation according to the first embodiment.
Figure 4B:
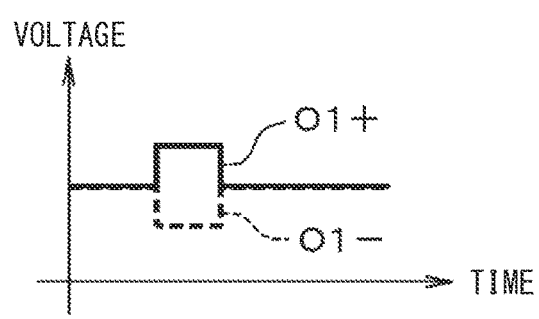
Figure 4C:
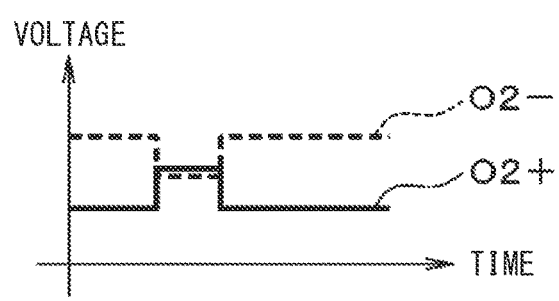
Figure 4D:
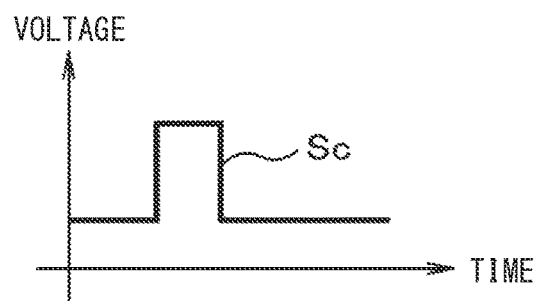

In the above configuration, the voltages Va and Vb are controlled so that the output offset voltage O2+ on the non-inverting side of the differential amplifier 8 is lower than the output offset voltage O2− on the inverting side and the output signals O2+ and O2− intersect with one another at a time when the voltage VDS reaches the reference voltage Vref. The output signals O2+ and O2− change as shown in FIG. 4C. The voltage amplitudes of the output signals O2+ and O2− correspond to the power supply voltage supplied to the differential amplifier 8.

The comparator 10 is configured to output a binary signal having a high level during a period in which the voltage of one input terminal is higher than the voltage of the other input terminal. Therefore, the detection signal Sc output from the comparator 10 has a low level when the voltage VDS is lower than the reference voltage Vref, and the detection signal Sc has a high level when the voltage VDS is equal to or higher than the reference voltage Vref. That is, the detection signal Sc is a binary signal, and the level of the detection signal Sc inverts in response to the voltage VDS reaching the reference voltage Vref.

The detection operation with reset function performed by the signal detection circuit 3B of the second configuration example will be described with reference to FIG. 5 to FIG. 9. The reset function is a function of canceling the output offset of the amplifier 11, specifically the differential amplifiers 7 and 8. The detection operation with reset function is performed by controlling on or off states of the switches in a first step, a second step, and a third step in the described order. In the first step, the switches SW1 to SW3 and SW5 are in turn-on states, and the switches SW4 and SW6 to SW8 are in turn-off states. In the second step, the switches SW1 to SW3, SW5, SW7 and SW8 are in turn-on states, and the switches SW4 and SW6 are in turn-off states. In the third step, the switches SW4 and SW6 are in turn-on states, and the switches SW1 to SW3, SW5, SW7 and SW8 are in turn-off states.

Figure 5:
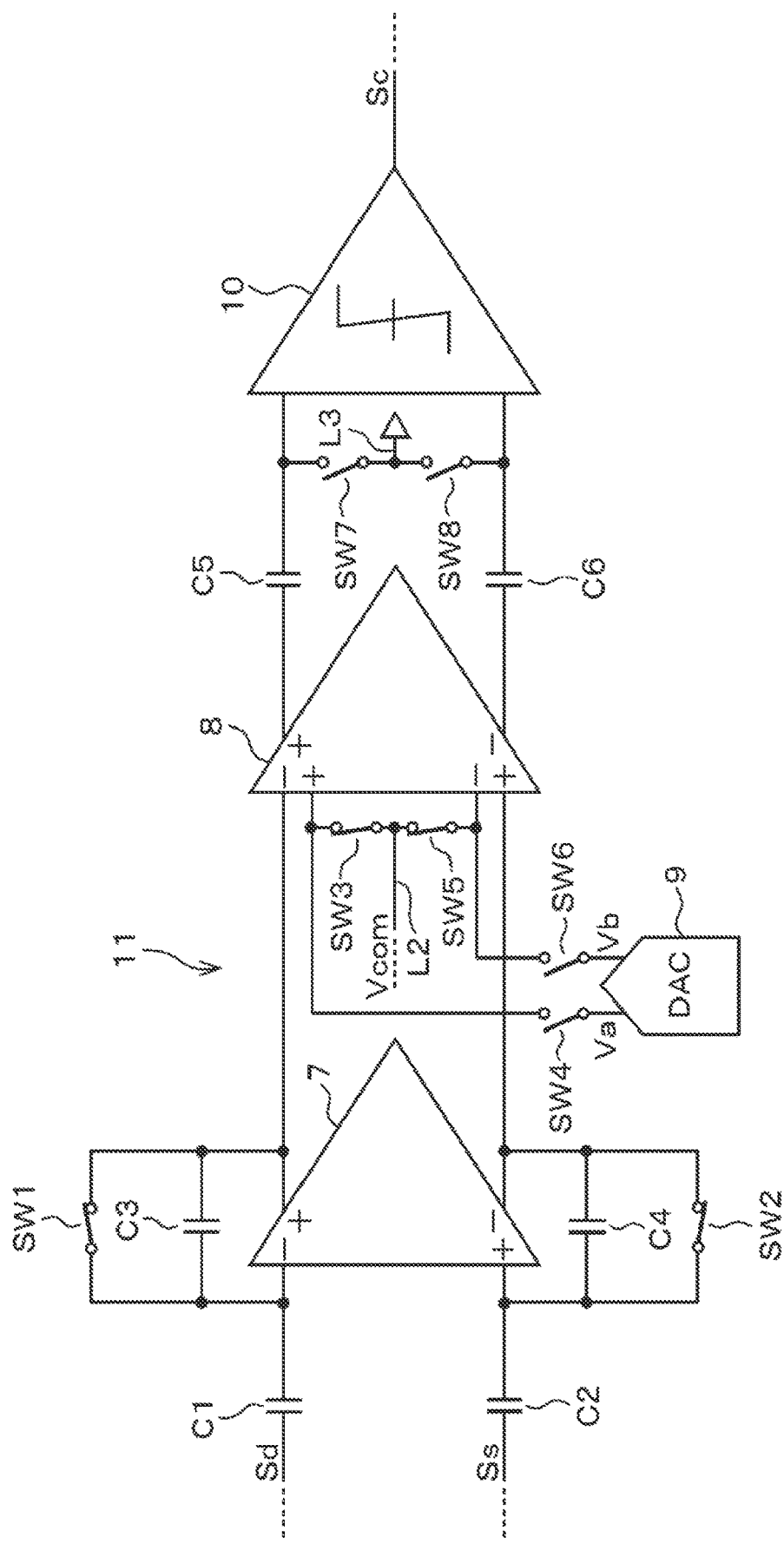
FIG. 5 is a diagram showing an on/off state of a switch during execution of a first step of a detection operation with a reset function according to the first embodiment.

In the first step, as shown in FIG. 5, the switches SW1 to SW3 and SW5 are set to turn-on states, and the switches SW4 and SW6 to SW8 are set to turn-off states. In the first step, the input and output of the differential amplifier 7, which is the input stage of the amplifier 11, is short-circuited by setting the switches as described above. As shown in FIG. 6A to FIG. 7B, the input signal I1+ applied to the non-inverting input terminal of the differential amplifier 7 and the input signal I1− applied to the inverting input terminal of the differential amplifier have the same signal levels regardless of the signals Sd and Ss. That is, the same signals are input to the input terminals of the amplifier 11 in the first step. Further, the output offset voltage on the non-inverting side and the output offset voltage on the inverting side of the differential amplifier 8 are set to the common voltage Vcom.

Figure 6A:
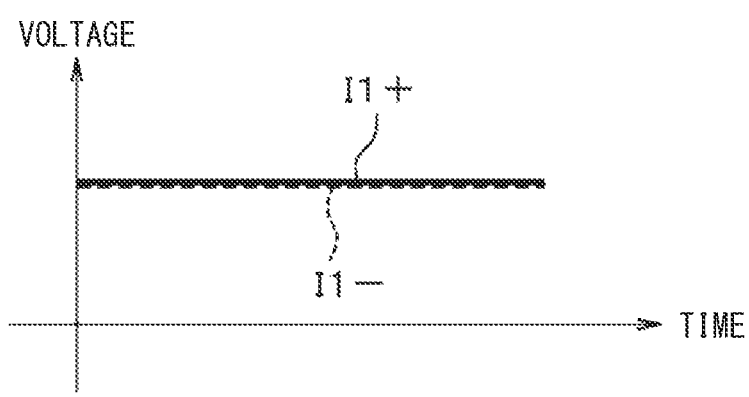
FIG. 6A and FIG. 6B are time charts schematically showing signals at respective points during execution of the first step of the detection operation with the reset function according to the first embodiment.
Figure 6B:
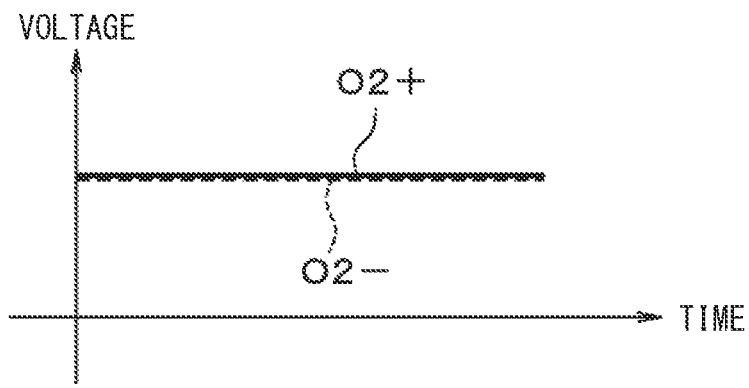
Figure 7A:
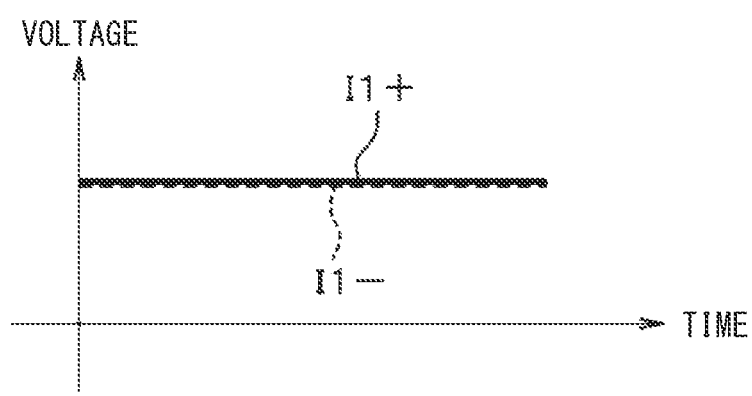
FIG. 7A and FIG. 7B are time charts schematically showing signals at respective points during execution of the first step of the detection operation with the reset function according to the first embodiment.
Figure 7B:
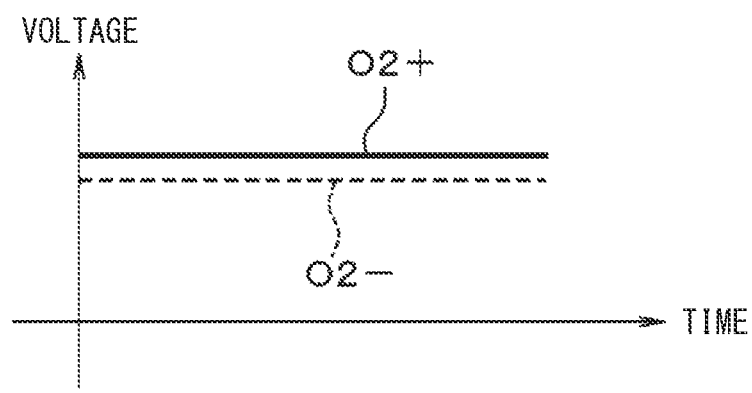

As a result, the output signals O2+ and O2− output from the differential amplifier 8 of the amplifier 11 correspond to the offsets of the differential amplifiers 7 and 8. The term "offset" referred to here is different from the offset intentionally applied according to the common voltage Vcom or the voltages Va and Vb of the DAC 9 described above. Herein, the offset is caused by the characteristic error of each element constituting the differential amplifiers 7 and 8 and the like, and the offset may cause an error in output. When there is no offset in the differential amplifiers 7 and 8, as shown in FIG. 6B, the output signals O2+ and O2− have the same levels, that is, the same voltage values. When there exists an offset in the differential amplifiers 7 and 8, as shown in FIG. 7B, the output signals O2+ and O2− have different levels from one another, and the difference between the two output signals corresponds to the above-described offset.

Figure 8:
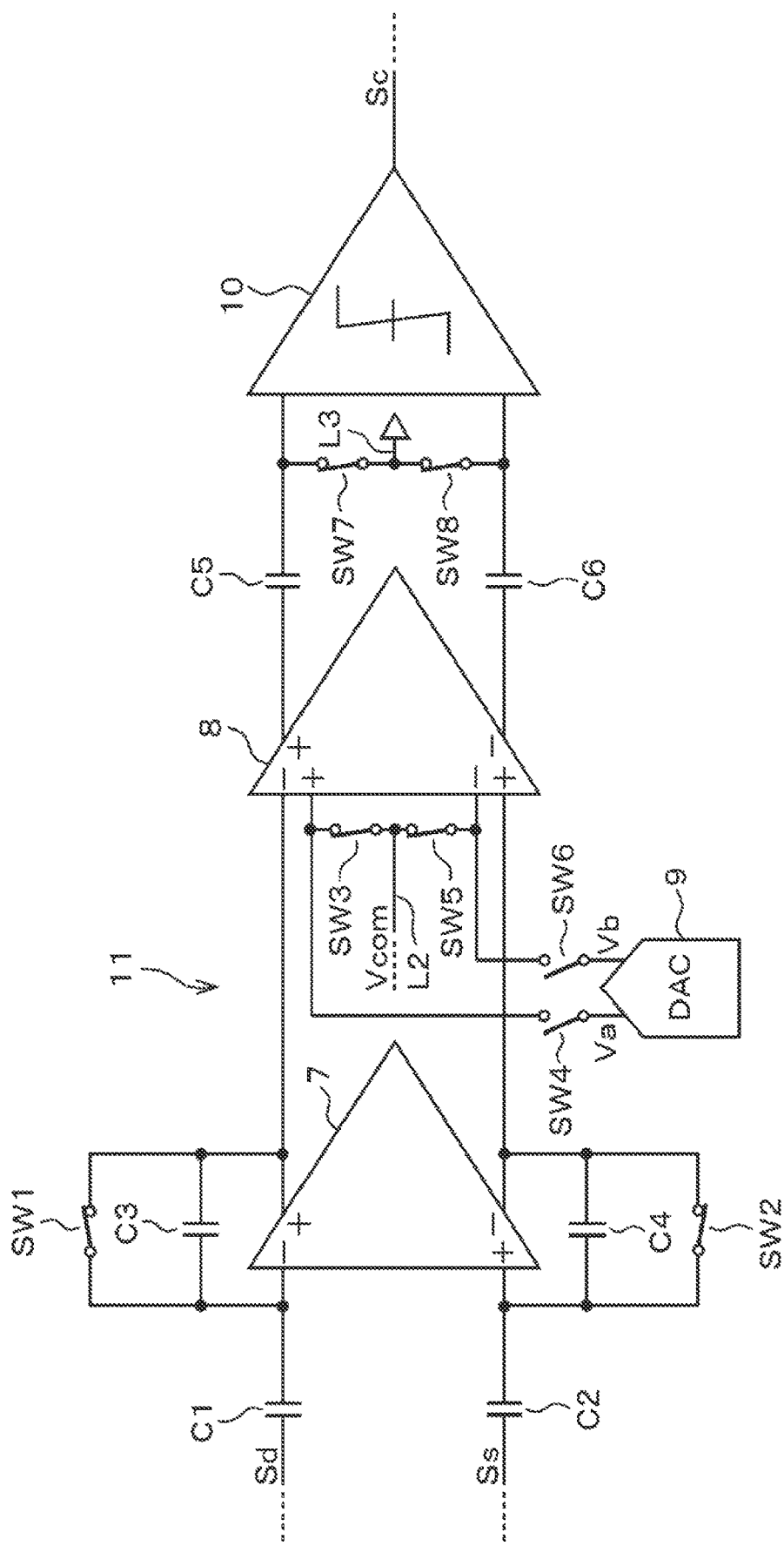
FIG. 8 is a diagram showing an on/off state of a switch during execution of a second step of the detection operation with the reset function according to the first embodiment.

In the second step, as shown in FIG. 8, the operation states of switches SW7 and SW8 change from off states to on states. As a result, electric charge corresponding to the respective voltages of the output signals O2+ and O2−, which are voltages with the potential of the power supply line L3 (for example, 0 Volt) as the reference, are injected into the capacitors C5 and C6. The amount of electric charge injected into the capacitor C5 is nearly the same as the amount of electric charge injected into the capacitor C6 when there is no offset in the differential amplifiers 7 and 8. When the offset exists in the differential amplifiers 7 and 8, the amount of electric charge injected into the capacitor C5 is different from the amount of electric charge injected into the capacitor C6, and the difference therebetween corresponds to the offset.

In the third step, as shown in FIG. 3, the switches SW1 to SW3, SW5, SW7 and SW8 are set to turn-off states, and the switches SW4 and SW6 are set to turn-on states. The operation in the third step is the same as the detection operation executed by the first configuration example described above. However, in the third step of the second configuration example, the amount of electric charge injected into the capacitor C5 is different from the amount of electric charge injected to the capacitor C6, and the difference corresponds to the offset of the differential amplifiers 7 and 8. The output signals O2+ and O2− of the differential amplifier 8 are applied to the comparator 10 via the capacitors C5 and C6. As a result, a zero point correction is carried out to the outputs of the differential amplifier 8 by the capacitors C5 and C6, and the voltages in which the offset of the differential amplifiers 7 and 8 are canceled are input to respective input terminals of the comparator 10.

Figure 9:
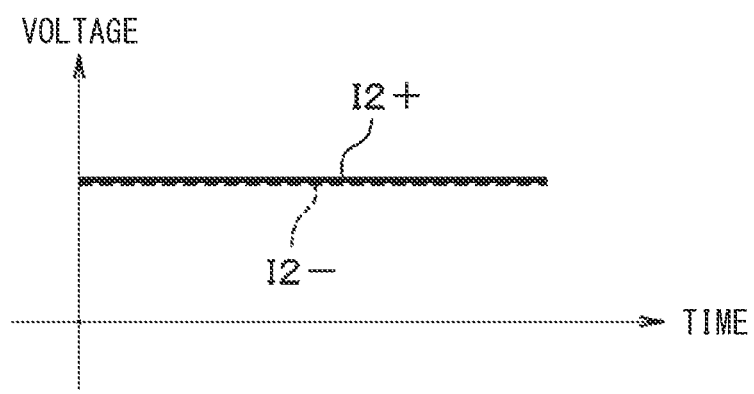
FIG. 9 is a time chart schematically showing a signal at a point during execution of a third step of the detection operation with the reset function according to the first embodiment.

Therefore, regardless of whether there is no offset or there is an offset in the differential amplifiers 7 and 8, under a condition that the input signals applied to the two input terminals of the differential amplifier 7 have the same levels, as shown in FIG. 9, the input signal I2+ applied to one input terminal of the comparator 10 and the input signal I2− applied to the other input terminal of the comparator 10 have the same level, that is, the same voltage value. As described above, the reset function is provided in the signal detection circuit 3B. Specifically, the offset amounts of the differential amplifiers 7 and 8 are stored in the capacitors C5 and C6 in the second step. In the third step, the detection operation is performed via the capacitors C5, C6 in which the offset amounts are stored. Thus, the adverse effect caused by the offsets of the differential amplifiers 7 and 8 on the signal detection result can be eliminated.

The above-described embodiment provides the following effect.

The signal detection circuit 3A, 3B in the present embodiment includes a capacitor C1 having one terminal connected to the drain of the switching element 2, a capacitor C2 having one terminal connected to the source of the switching element 2, and the detection circuit 6, 12. The detection circuit 6, 12 has a differential circuit configuration. The detection circuit 6, 12 receives, as input signals, the signal from the other terminal of the capacitor C1 and the signal from the other terminal of the capacitor C2, and detects, based on the input signals, the signal on the main terminal of the switching element 2 as the detection target signal.

According to the above configuration, the drain signal Sd and the source signal Ss of the switching element 2 are input to the detection circuit 6, 12 in differential manner. Thus, in a case where the capacitances of the capacitors C1 and C2 disposed in the input side are relatively small, the adverse effect of the parasitic capacitance existing in the input terminal or the like of the differential amplifier 7 included in the detection circuit 6, 12 on the detection accuracy of the detection target signal can be suppressed. Therefore, elements configuring the signal detection circuit 3A, 3B, which include the capacitors C1 and C2, can be integrated together. According to the present embodiment, it is possible to obtain an excellent effect that the detection accuracy can be improved while suppressing an increase in circuit size.

The signal detection circuit 3B is configured to have the reset function that cancels the output offset of the amplifier 11, specifically, the output offset of the differential amplifiers 7 and 8. With this configuration, the adverse effect of the offset caused by the characteristic error of elements configuring the differential amplifiers 7 and 8 on the signal detection result can be suppressed. Therefore, according to this configuration, the signal detection accuracy can be further improved.

In the signal detection circuit 3A, 3B, one terminal of the capacitor C1 is directly connected to the drain of the switching element 2 without an electrically openable/closable switch, and one terminal of the capacitor C2 is directly connected to the source of the switching element 2 without an electrically openable/closable switch. That is, in the above configuration, no switch is provided in front stage of the signal input. With such a configuration, the following effects can be obtained. In the conventional signal detection circuit (hereinafter referred to as a comparative example) which includes a switched capacitor circuit and amplifiers, a switch is usually provided in front stage of the signal input.

This is because the switching operation that switches on state and off state of the switch (hereinafter also referred to as alternative current (AC) operation) generates AC waveform and applies the generated AC waveform to the capacitor included in the switched capacitor circuit. In such a comparative example, when the voltage of detection target signal is relatively high as described in the present embodiment, it is necessary to use a high withstand voltage element as the switch element provided in front stage of the signal input. In a case where the high withstand voltage element is provided, as the switch element, in front stage of the signal input, decrease in response speed and increase in circuit size may occur in the comparative example.

In the present embodiment, a transient waveform, that is, the AC waveform is applied to the signal detection circuit 3A, 3B on the input side. Thus, the input voltage can be applied to the capacitor without providing a switch in front stage of the signal input side different from the comparative example in which the switch is provided in front stage of the signal input side. According to the configuration of the present embodiment, since the switch is not provided in front stage of the signal input side, it is possible to prevent the influence of the leak current and malfunction such as oscillation that are caused by the switch. Further, according to the configuration of the present embodiment, it is possible to prevent attenuation of high speed signal and the circuit size can be decreased to a compact size.

Second Embodiment

Figure 10:
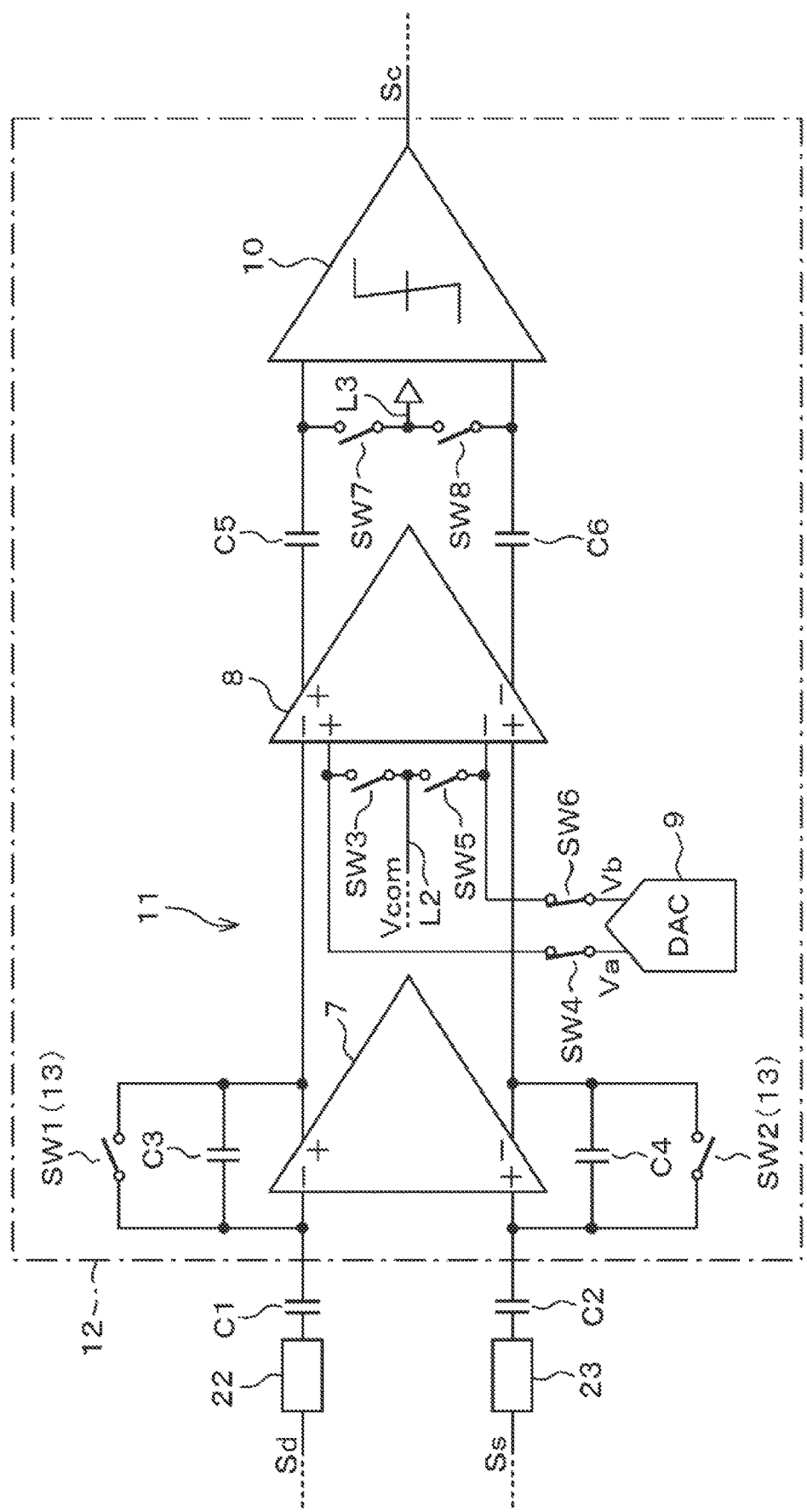
FIG. 10 is a diagram schematically showing an exemplary configuration of a signal detection circuit according to a second embodiment.

The following will describe a second embodiment of the present disclosure with reference to FIG. 10. In the second embodiment, a configuration of the signal detection circuit is changed from the second configuration example of the first embodiment. Similar change can also be made with respect to the first configuration example of the first embodiment.

As shown in FIG. 10, a signal detection circuit 21 according to the present embodiment is different from the signal detection circuit 3B according to the second configuration example of the first embodiment shown in FIG. 3. Specifically, resistors 22 and 23 are added to the signal detection circuit 21 compared with the signal detection circuit 3B.

The resistor 22 is connected between one terminal of the capacitor C1 and the drain of the switching element 2 in series, and corresponds to a first passive element. The resistor 23 is connected between one terminal of the capacitor C2 and the source of the switching element 2 in series, and corresponds to a second passive element. The first passive element and the second passive element are not limited to the resistors 22 and 23, and may be other passive elements such as inductors.

The present embodiment also provides the same effects as those of the first embodiment. In the signal detection circuit 21 of the present embodiment, resistors 22 and 23 are provided in the signal input stage. Therefore, influence of static electricity and the like on each element configuring the signal detection circuit 21 can be suppressed. In the present disclosure, static electricity may also be referred to as ESD. According to the present embodiment, it is possible to realize ESD protection that protects each element configuring the signal detection circuit 21 from ESD.

Third Embodiment

Figure 11:
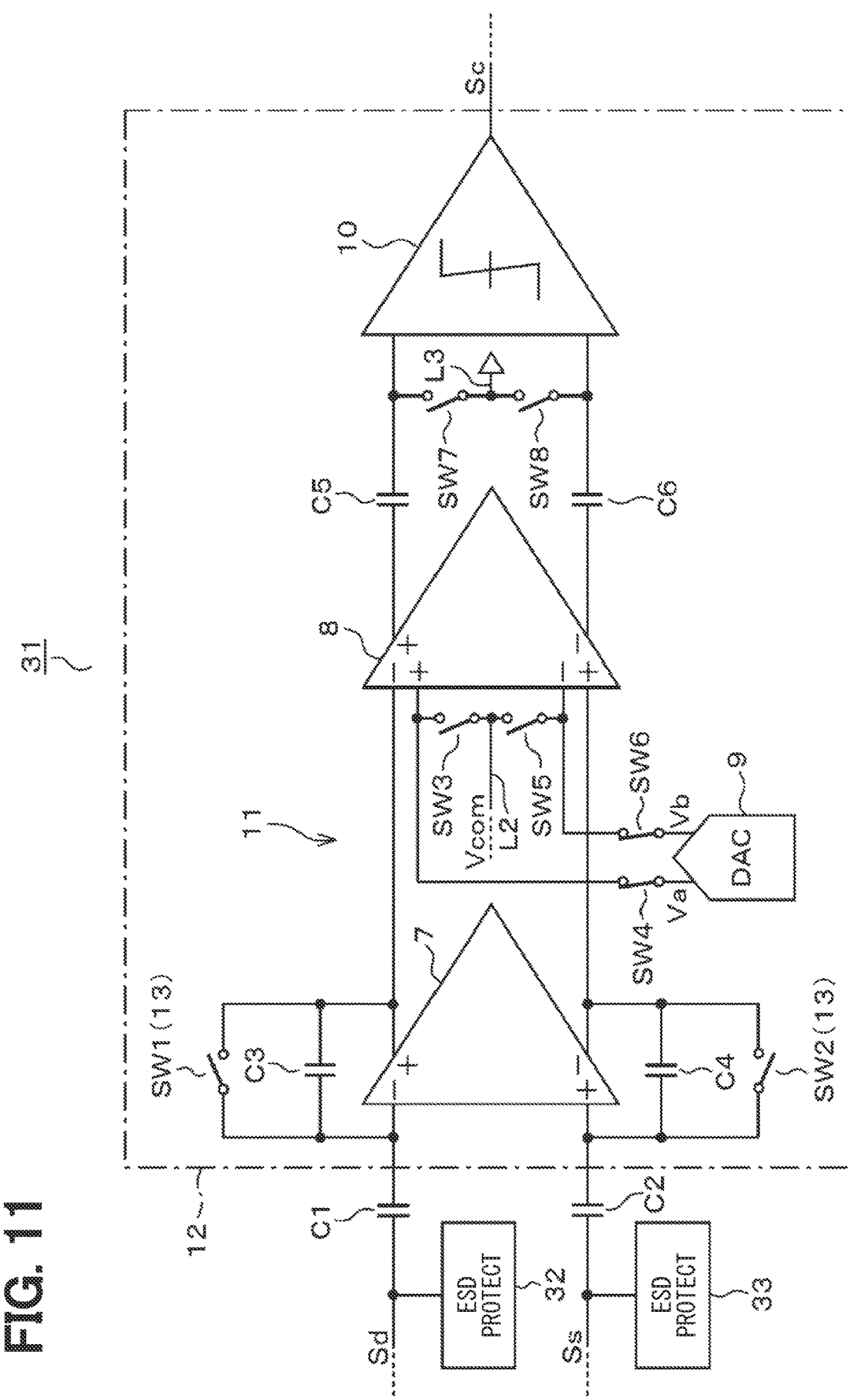
FIG. 11 is a diagram schematically showing an exemplary configuration of a signal detection circuit according to a third embodiment.

The following will describe a third embodiment of the present disclosure with reference to FIG. 11. In the third embodiment, a configuration of the signal detection circuit is changed from the second configuration example of the first embodiment. Similar change can also be made with respect to the first configuration example of the first embodiment.

As shown in FIG. 11, a signal detection circuit 31 according to the present embodiment is different from the signal detection circuit 3B according to the second configuration example of the first embodiment shown in FIG. 3. Specifically, ESD protection elements 32 and 33 are added to the signal detection circuit 31 compared with the signal detection circuit 3B.

The ESD protection element 32 is connected to a path connecting one terminal of the capacitor C1 and the drain of the switching element 2, and corresponds to a first static electricity protection unit. The ESD protection element 33 is connected to a path connecting one terminal of the capacitor C2 and the source of the switching element 2, and corresponds to a second static electricity protection unit. Each ESD protection element 32, 33 includes a diode, or a Zener diode, or a combination of the diode and the Zener diode. The ESD protection element 32, 33 releases the ESD input to the signal detection circuit 31 toward the ground or the like.

The present embodiment also provides the same effects as those of the first embodiment. In the signal detection circuit 31 of the present embodiment, the ESD protection elements 32, 33 are provided in the signal input stage. Therefore, influence of static electricity and the like on each element configuring the signal detection circuit 31 can be suppressed. According to the present embodiment, it is possible to realize ESD protection that protects each element configuring the signal detection circuit 31 from ESD.

Fourth Embodiment

Figure 12:
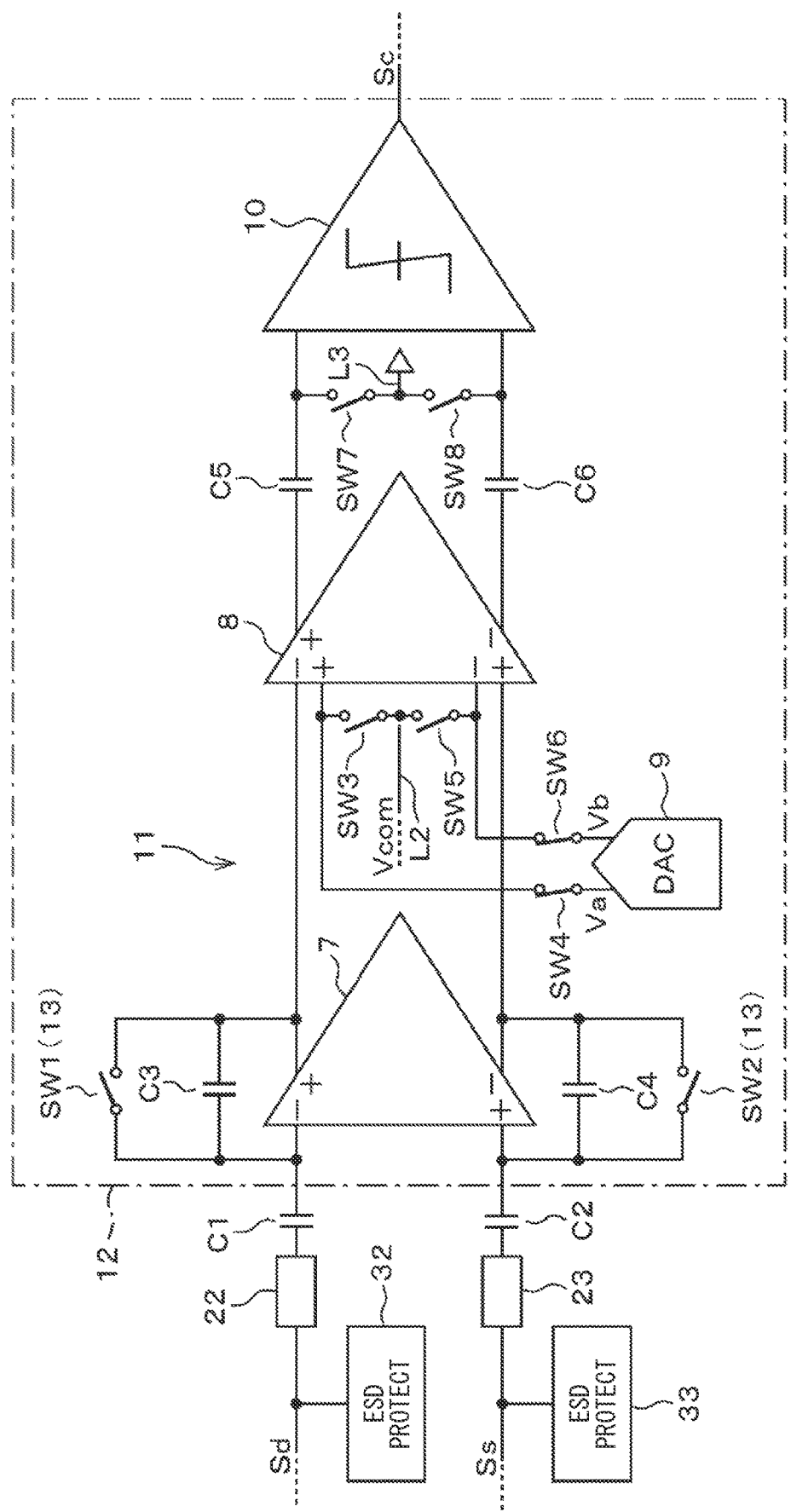
FIG. 12 is a diagram schematically showing a first configuration example of a signal detection circuit according to a fourth embodiment.
Figure 13:
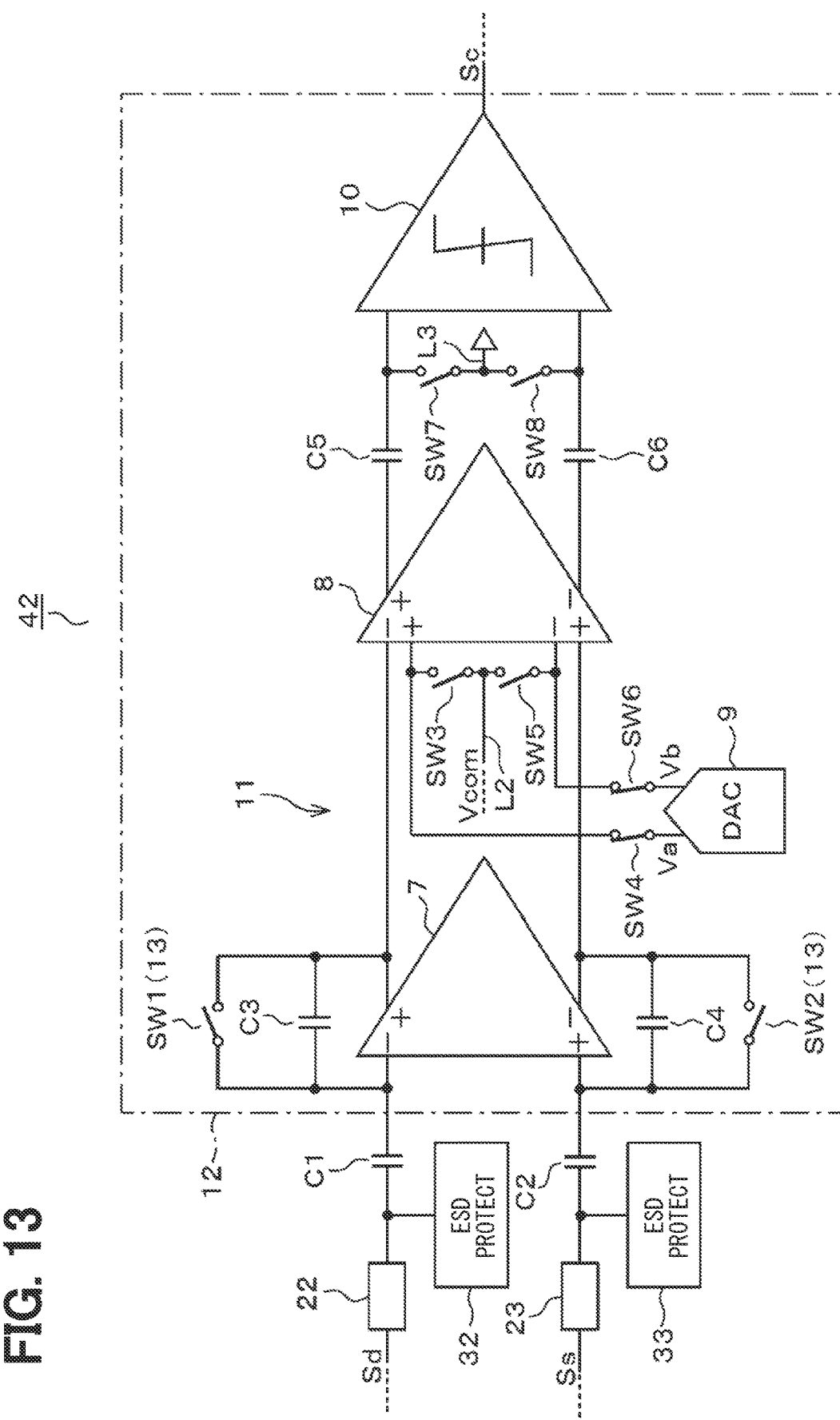
FIG. 13 is a diagram schematically showing a second configuration example of a signal detection circuit according to the fourth embodiment.

The following will describe a fourth embodiment of the present disclosure with reference to FIG. 12 and FIG. 13. In the fourth embodiment, a configuration of the signal detection circuit is changed from the second configuration example of the first embodiment. Similar change can also be made with respect to the first configuration example of the first embodiment.

The signal detection circuit of the present embodiment includes the ESD protection elements 32 and 33 similar to the signal detection circuit 31 of the third embodiment shown in FIG. 11, and also includes the resistors 22 and 23 similar to the signal detection circuit 21 of the second embodiment shown in FIG. 10. The following will describe two specific configuration examples in which the connection points of the ESD protection elements 32 and 33 are different.

First Configuration Example

As shown in FIG. 12, in a signal detection circuit 41 of the first configuration example, the ESD protection element 32 is connected to the path between the drain of the switching element 2 and the resistor 22. The ESD protection element 33 is connected to the path between the source of the switching element 2 and the resistor 23.

Second Configuration Example

As shown in FIG. 13, in a signal detection circuit 42 of the second configuration example, the ESD protection element 32 is connected to the path between the resistor 22 and the capacitor C1. The ESD protection element 33 is connected to the path between the resistor 23 and the capacitor C2.

The present embodiment also provides the same effects as those of the first embodiment. In the signal detection circuit 41, 42 of the present embodiment, the resistors 22, 23 and the ESD protection elements 32, 33 are provided in the signal input stage. Therefore, influence of static electricity and the like on each element configuring the signal detection circuit 31 can be further suppressed. According to the present embodiment, it is possible to realize ESD protection that protects each element configuring the signal detection circuit 41, 42 from ESD with higher reliability.

Fifth Embodiment

Figure 14:
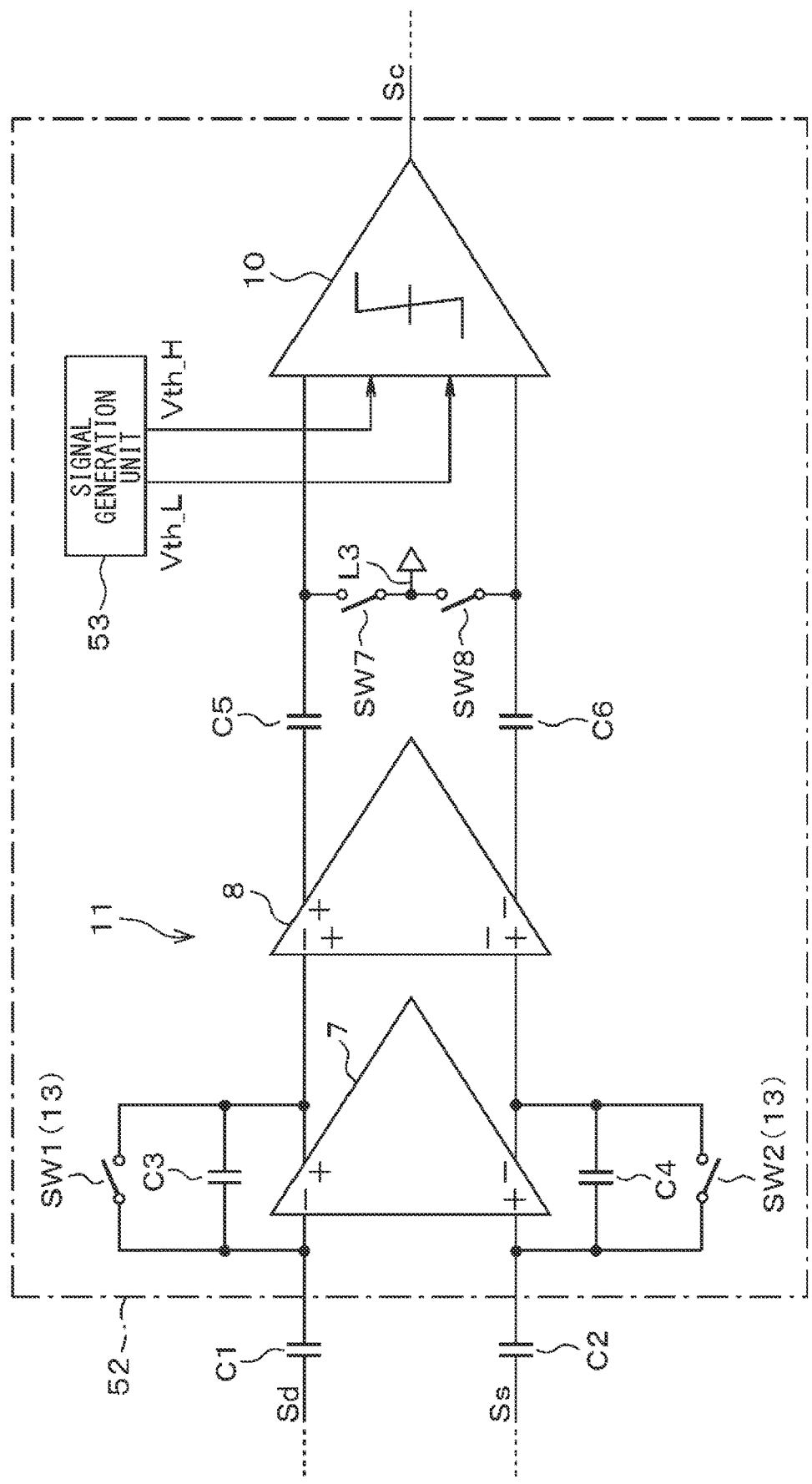
FIG. 14 is a diagram schematically showing an exemplary configuration of a signal detection circuit according to a fifth embodiment.
Figure 15:
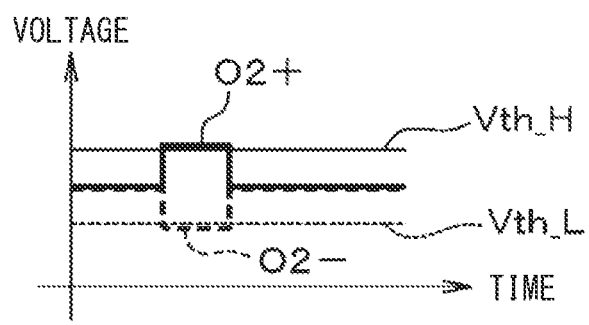
FIG. 15 is a time chart schematically showing output signals and threshold voltages of a differential amplifier according to the fifth embodiment.

The following will describe a fifth embodiment of the present disclosure with reference to FIG. 14 and FIG. 15. In the fifth embodiment, a configuration of the signal detection circuit is changed from the second configuration example of the first embodiment. Similar change can also be made with respect to the first configuration example of the first embodiment.

As shown in FIG. 14, a signal detection circuit 51 of the present embodiment includes a detection circuit 52 instead of the detection circuit 12 of the signal detection circuit 3B according to the first embodiment shown in FIG. 3.

The detection circuit 52 is different from the detection circuit 12 in that the DAC 9 and the switches SW3 to SW6 are omitted, and a signal generation unit 53 is added. In this case, the output offset voltages on the non-inverting side and the inverting side of the differential amplifier 8 are set to the same voltage (for example, the common voltage Vcom). In this configuration, the comparator 10 is configured to execute determination operation based on the input potential difference.

The signal generation unit 53 generates a threshold voltage Vth_H corresponding to an input signal applied to one input terminal of the comparator 10 and a threshold voltage Vth_L corresponding to an input signal applied to the other input terminal of the comparator 10. The signal generation unit 53 outputs the generated threshold voltages to the comparator 10. Each voltage value of the threshold voltage Vth_H and the threshold voltage Vth_L is set according to the value of the reference voltage Vref. As shown in FIG. 15, each voltage value of the threshold voltage Vth_H and the threshold voltage Vth_L is set so that the output signal O2+ of the differential amplifier 8 reaches the threshold voltage Vth_H and the output signal O2− reaches the threshold voltage Vth_L at the time when the voltage VDS reaches the reference voltage Vref.

As described above, in the signal detection circuit 51 of the present embodiment, the voltage adjustment according to the reference voltage Vref is performed in the final stage comparator 10. In this configuration, a detection operation can be executed similar to the detection operation in which the differential amplifier 8 adjusts the voltage according to the reference voltage Vref as in the signal detection circuit 3B of the first embodiment.

Thus, the same effect as the first embodiment can be achieved in the present embodiment. In the signal detection circuit 51 of the present embodiment, the number of switches is reduced compared with the signal detection circuit 3B of the first embodiment. Thus, the circuit size can be reduced to a compact size. Therefore, according to the present embodiment, it is possible to further suppress an increase in circuit size compared with the first embodiment.

Sixth Embodiment

Figure 16:
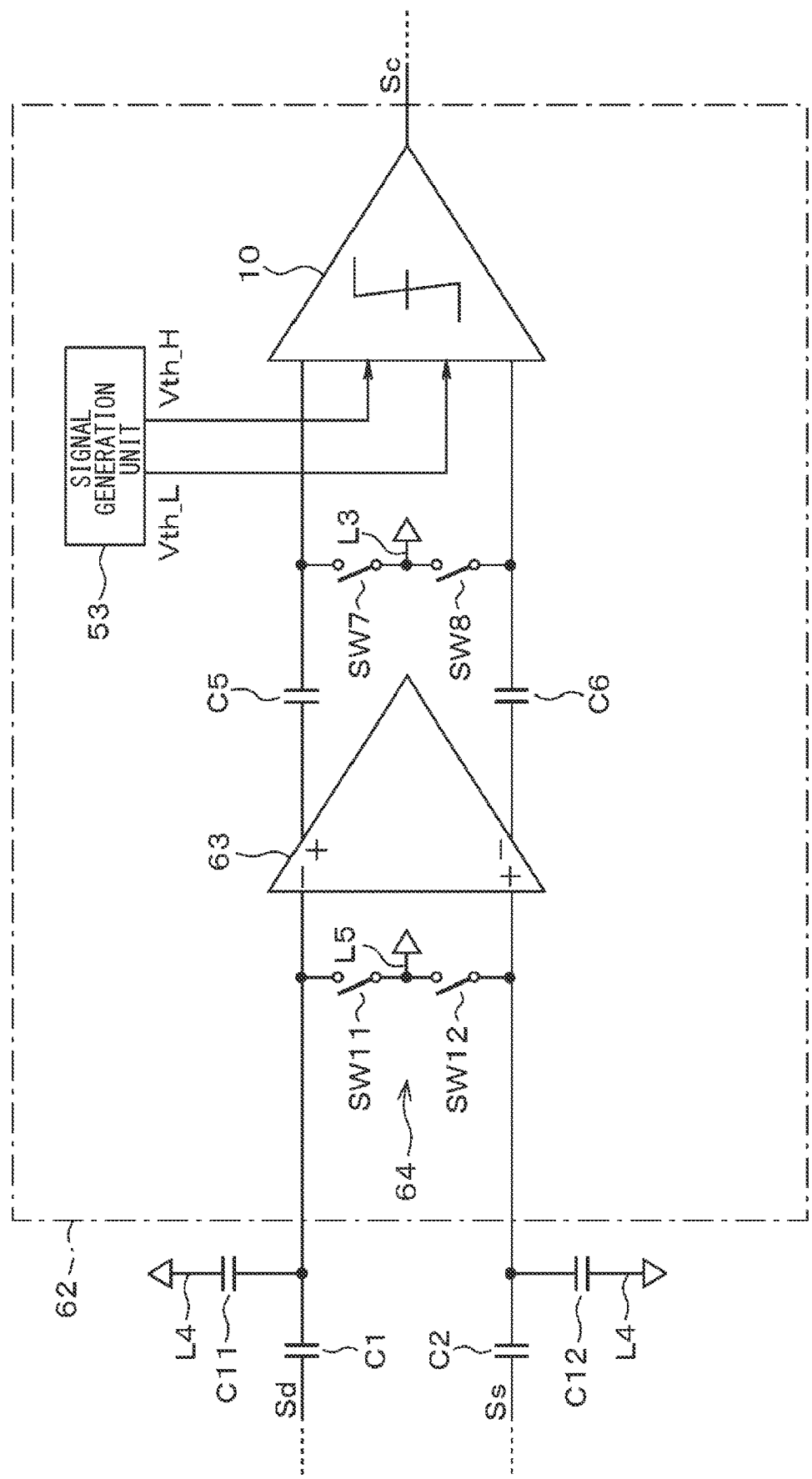
FIG. 16 is a diagram schematically showing an exemplary configuration of a signal detection circuit according to a sixth embodiment.

The following will describe a sixth embodiment of the present disclosure with reference to FIG. 16. In the sixth embodiment, a configuration of the signal detection circuit is changed from the second configuration example of the first embodiment. Similar change can also be made with respect to the first configuration example of the first embodiment.

As shown in FIG. 16, compared with the signal detection circuit 51 according to the fifth embodiment shown in FIG. 14, a signal detection circuit 61 according to the present embodiment further includes a detection circuit 62 instead of the detection circuit 52 of the fifth embodiment, and the signal detection circuit 61 further includes capacitors C11, C12.

Compared with the detection circuit 52 according to the fifth embodiment, the detection circuit 62 does not include the capacitors C3, C4, the switches SW1, SW2 and the differential amplifiers 7 and 8. Instead, the detection circuit 62 includes a differential amplifier 63 and switches SW11 and SW12. One terminal of the capacitor C11 is connected to a power supply line L4 to which a predetermined reference potential (for example, 0 volt) is applied, and the other terminal of the capacitor C11 is connected to one input terminal of the detection circuit 62, specifically, an inverting input terminal of the differential amplifier 63.

One terminal of the capacitor C12 is connected to the power supply line L4, and the other terminal of the capacitor C12 is connected to the other input terminal of the detection circuit 62, specifically, a non-inverting input terminal of the differential amplifier 63. Similar to the differential amplifier 7, the differential amplifier 63 has a fully differential configuration. In the present embodiment, one differential amplifier 63 configures the amplifier that receives, as input signals, signals from the capacitors C1 and C2 and outputs signals obtained by amplifying the input signals. The inverting input terminal of the differential amplifier 63 is connected to a power supply line L5 to which a predetermined reference potential (for example, 0 volt) is applied via the switch SW11, and the non-inverting input terminal of the differential amplifier 63 is connected to the power supply line L5 via the switch SW12.

The switches SW11 and SW12 function as an identical signal input unit 64 that inputs the identical signal to each input terminal of the differential amplifier 63. Further, the switches SW11 and SW12 are set to turn-on states during a first half of the period in which the detection operation is performed, and set to turn-off states in the second half of the period in which the detection operation is performed. By turning on the switches SW11 and SW12, each input signal to the differential amplifier 63 can be reset to the reference potential (for example, 0 volt) of the power supply line L5.

In the above configuration, the capacitors C1 and C11 configure a voltage dividing circuit that divides the signal Sd, specifically, the drain voltage of the switching element 2. Similarly, the capacitors C2 and C12 configure a voltage dividing circuit that divides the signal Ss, specifically, the source voltage of the switching element 2. Therefore, during an execution of detection operation by the signal detection circuit 61, a division voltage signal generated by dividing the voltage signal Sd is applied to one input terminal of the differential amplifier 63 and a division voltage signal generated by dividing the voltage signal Ss is applied to the other input terminal of the differential amplifier 63. This configuration is similar to the signal detection circuit 3B according to the first embodiment.

When the above-described signals are input to the differential amplifier 63, the differential amplifier 63 outputs, to the comparator 10, signals representing a difference between the signal Sd and the signal Ss. The output signals output from the differential amplifier 63 are differential signals having phases opposite to one another. Similar to the signal detection circuit 51 of the fifth embodiment, in the signal detection circuit 61 of the present embodiment, the voltage adjustment according to the reference voltage Vref is performed in the comparator 10, which is the final stage of the signal detection circuit. According to the signal detection circuit 61 of the present embodiment, detection operation similar to the detection operation of the signal detection circuit 3B in the first embodiment can be performed.

Thus, the same effect as the first embodiment can be achieved in the present embodiment. In the signal detection circuit 61 of the present embodiment, the number of differential amplifiers is reduced from two to one compared with the signal detection circuit 3B of the first embodiment. Thus, the circuit size can be reduced to a compact size. Therefore, according to the present embodiment, it is possible to further suppress an increase in circuit size compared with the first embodiment.

Other Embodiments

The present disclosure is not limited to the embodiments that have been described above and illustrated in the drawings, but can arbitrarily be modified, combined, or expanded without departing from the spirit of the present disclosure. The numerical values and the like shown in the embodiments described above are examples, and are not limited to those examples.

The values of the reference potentials applied to the power supply lines L3, L4 and L5 may be appropriately changed according to various specifications. Each reference potential may be set to a potential same as the potential of the DC power supply line L1 connected to the source of the switching element 2, or may be set to a different potential. Further, all of the reference potentials do not necessarily have to be the same potential, and may be set to be different from one other. Further, the value of each reference potential, the value of the reference voltage Vref, the relationship between these values or the like are not limited to those examples described in each of the above embodiments, and may be appropriately changed according to the specifications of the actually applied device and the like.

Among two switching elements constituting the half-bridge circuit, the drive target of the drive circuit 1 may be the switching element disposed on the high side. In this case, according to the signal detection circuit 3 of each of the above-described embodiments, it is possible to detect the detection target signal. Herein, the detection target signal is the signal of the main terminal of the switching element to be driven by the drive circuit 1. A switch may be provided in front stage of the signal inputs of the signal detection circuits 3A and 3B.

Although the present disclosure has been described in accordance with embodiments, it is understood that the present disclosure is not limited to such embodiments or structures. The present disclosure incorporates various modifications and variations within the scope of equivalents. In addition, various combinations and configurations, as well as other combinations and configurations that include only one element, more, or less, are within the scope and spirit of the present disclosure.

What is claimed is:

1. A signal detection circuit comprising:
a first capacitor having a first terminal connected with a first main terminal of a switching element;
a second capacitor having a first terminal connected with a second main terminal of the switching element; and
a detection circuit having a differential circuit configuration, the detection circuit receiving, as input signals, a signal from a second terminal of the first capacitor and a signal from a second terminal of the second capacitor, the detection circuit detecting detection target signals based on the input signals, and the detection target signals including a signal of the first main terminal of the switching element and a signal of the second main terminal of the switching element, wherein
the switching element is a single switching transistor, and the detection circuit includes:
an amplifier that receives, as input signals, the signal from the second terminal of the first capacitor and the signal from the second terminal of the second capacitor, the amplifier amplifying the input signals and outputting the amplified signals as output signals;
a comparator receiving the output signals output from the amplifier;
an identical signal input unit that inputs identical signals to input terminals of the amplifier;
a storage capacitor having a first terminal connected with an output terminal of the amplifier and a second terminal connected with an input terminal of the comparator; and
a switch connecting the second terminal of the storage capacitor to a predetermined reference potential.

2. The signal detection circuit according to claim 1, wherein
the first terminal of the first capacitor is connected with the first main terminal of the switching element without an electrically openable and closable switch, and
the first terminal of the second capacitor is connected with the second main terminal of the switching element without an electrically openable and closable switch.

3. The signal detection circuit according to claim 1, further comprising
a first passive element connected in series between the first terminal of the first capacitor and the first main terminal of the switching element; and
a second passive element connected in series between the first terminal of the second capacitor and the second main terminal of the switching element.

4. The signal detection circuit according to claim 1, further comprising
a first static electricity protection unit connected to a path that connects the first terminal of the first capacitor and the first main terminal of the switching element; and
a second static electricity protection unit connected to a path that connects the first terminal of the second capacitor and the second main terminal of the switching element.

5. The signal detection circuit according to claim 1, wherein
the first main terminal of the switching element includes a drain terminal; and
the second main terminal of the switching element includes a source terminal.

6. The signal detection circuit according to claim 1, wherein
the comparator outputs a detection signal.

7. A signal detection circuit comprising:
a first capacitor having a first terminal connected with a first main terminal of a switching element;
a second capacitor having a first terminal connected with a second main terminal of the switching element; and
a detection circuit having a differential circuit configuration, the detection circuit receiving, as input signals, a signal from a second terminal of the first capacitor and a signal from a second terminal of the second capacitor, the detection circuit detecting detection target signals based on the input signals, and the detection target signals including a signal of the first main terminal of the switching element and a signal of the second main terminal of the switching element, wherein
the detection circuit includes:
an amplifier that receives, as input signals, the signal from the second terminal of the first capacitor and the signal from the second terminal of the second capacitor, the amplifier amplifying the input signals and outputting the amplified signals as output signals;

a comparator receiving the output signals output from the amplifier;

an identical signal input unit that inputs identical signals to input terminals of the amplifier;

a storage capacitor having a first terminal connected with an output terminal of the amplifier and a second terminal connected with an input terminal of the comparator; and a switch connecting the second terminal of the storage capacitor to a predetermined reference potential.

8. The signal detection circuit according to claim 7, wherein the first terminal of the first capacitor is connected with the first main terminal of the switching element without an electrically openable and closable switch, and the first terminal of the second capacitor is connected with the second main terminal of the switching element without an electrically openable and closable switch.

9. The signal detection circuit according to claim 7, further comprising a first passive element connected in series between the first terminal of the first capacitor and the first main terminal of the switching element; and a second passive element connected in series between the first terminal of the second capacitor and the second main terminal of the switching element.

10. The signal detection circuit according to claim 7, further comprising a first static electricity protection unit connected to a path that connects the first terminal of the first capacitor and the first main terminal of the switching element; and a second static electricity protection unit connected to a path that connects the first terminal of the second capacitor and the second main terminal of the switching element.

* * * * *